United States Patent
Lu et al.

(10) Patent No.: US 9,932,852 B2
(45) Date of Patent: Apr. 3, 2018

(54) SENSOR ASSEMBLY FOR ROTATING DEVICES AND METHODS FOR FABRICATING

(75) Inventors: Dan Tho Lu, Minden, NV (US); Lam Arthur Campbell, Minden, NV (US)

(73) Assignee: General Electric Company, Schenectady, NY (US)

( * ) Notice: Subject to any disclaimer, the term of this patent is extended or adjusted under 35 U.S.C. 154(b) by 720 days.

(21) Appl. No.: 13/205,371

(22) Filed: Aug. 8, 2011

(65) Prior Publication Data

US 2013/0041622 A1    Feb. 14, 2013

(51) Int. Cl.
| | |
|---|---|
| F01D 21/00 | (2006.01) |
| F02C 9/00 | (2006.01) |
| G01M 1/00 | (2006.01) |
| G01D 5/12 | (2006.01) |
| G01B 7/14 | (2006.01) |
| H03K 17/95 | (2006.01) |
| G01B 7/02 | (2006.01) |

(52) U.S. Cl.
CPC ............ *F01D 21/00* (2013.01); *F02C 9/00* (2013.01); *G01B 7/023* (2013.01); *G01B 7/14* (2013.01); *G01D 5/12* (2013.01); *G01M 1/00* (2013.01); *H03K 17/95* (2013.01); *H03K 17/9522* (2013.01); *H03K 2017/9527* (2013.01)

(58) Field of Classification Search
CPC . F01D 21/00; F02C 9/00; G01M 1/00; G01D 5/12; G01B 7/023; G01B 7/14; H03K 17/9522; H03K 2017/9527; H03K 17/95
USPC ........................................................ 702/151
See application file for complete search history.

(56) References Cited

U.S. PATENT DOCUMENTS

| | | | |
|---|---|---|---|
| 3,400,340 A | * | 9/1968 | Papadakis ................. B06B 3/00 148/325 |
| 4,139,833 A | | 2/1979 | Kirsch |
| 4,563,643 A | * | 1/1986 | Leschek et al. ......... 324/207.16 |
| 4,593,245 A | | 6/1986 | Viertl et al. |
| 5,033,010 A | | 7/1991 | Lawrence et al. |
| 5,097,707 A | | 3/1992 | Church |
| 5,588,202 A | * | 12/1996 | Ehlers et al. ................... 29/606 |
| 5,801,532 A | * | 9/1998 | Patton et al. ................. 324/238 |

(Continued)

FOREIGN PATENT DOCUMENTS

| | | |
|---|---|---|
| JP | S62114529 A | 5/1987 |
| JP | H06109410 A | 4/1994 |

(Continued)

OTHER PUBLICATIONS

VG High Temperature Displacement Converter (n. d.) available at www.shinkawa.com.cn/Pdf/Vg.pdf last visited Jun. 10, 2011.

(Continued)

*Primary Examiner* — Alexander Satanovsky
(74) *Attorney, Agent, or Firm* — Fletcher Yoder P.C.

(57) ABSTRACT

A sensor assembly is described herein. The sensor assembly includes a housing that includes an inner surface that defines a cavity within the housing, and a proximity sensor positioned within the cavity. The proximity sensor includes a first connector, a second connector, and a substantially planar sensing coil that extends between the first connector and the second connector. The sensing coil extends outwardly from the first connector such that the second connector is radially outwardly from the first connector.

14 Claims, 5 Drawing Sheets

(56) References Cited

U.S. PATENT DOCUMENTS

| | | | |
|---|---|---|---|
| 5,841,277 A * | 11/1998 | Hedengren et al. | 324/240 |
| 5,866,824 A * | 2/1999 | Schieber | 73/861.79 |
| 6,043,644 A * | 3/2000 | de Coulon | G01P 3/488 |
| | | | 324/164 |
| 6,307,814 B1 * | 10/2001 | Farine et al. | 368/80 |
| 6,346,807 B1 * | 2/2002 | Slates | 324/207.16 |
| 6,445,271 B1 * | 9/2002 | Johnson | H01F 17/0033 |
| | | | 257/531 |
| 6,469,609 B2 | 10/2002 | Lee et al. | |
| 6,545,469 B1 | 4/2003 | Batzinger et al. | |
| 6,776,041 B1 | 8/2004 | Hauer et al. | |
| 6,830,379 B2 | 12/2004 | Morita et al. | |
| 6,891,711 B1 | 5/2005 | Kurtz | |
| 7,155,984 B2 | 1/2007 | Fujita et al. | |
| 7,260,991 B2 | 8/2007 | Maurer et al. | |
| 7,478,562 B2 | 1/2009 | Kurtz et al. | |
| 7,554,324 B2 * | 6/2009 | Gualtieri | 324/207.26 |
| 8,104,358 B1 | 1/2012 | Jia et al. | |
| 8,639,352 B2 * | 1/2014 | Wang et al. | 607/116 |
| 2001/0019262 A1 * | 9/2001 | Woolsey et al. | 324/207.26 |
| 2002/0057199 A1 * | 5/2002 | Kroll | 340/541 |
| 2002/0164472 A1 * | 11/2002 | Sugimura | A61L 27/30 |
| | | | 428/304.4 |
| 2002/0168837 A1 | 11/2002 | Hsu et al. | |
| 2003/0024914 A1 * | 2/2003 | Aleshin | 219/121.83 |
| 2003/0080736 A1 | 5/2003 | Batzinger et al. | |
| 2003/0222638 A1 * | 12/2003 | Twerdochlib | 324/207.16 |
| 2003/0222640 A1 * | 12/2003 | Twerdochlib et al. | 324/207.17 |
| 2004/0110016 A1 * | 6/2004 | Hamaya | C23C 4/18 |
| | | | 428/472 |
| 2004/0247446 A1 * | 12/2004 | Berryman et al. | 417/20 |
| 2005/0109081 A1 | 5/2005 | Zribi et al. | |
| 2005/0114071 A1 | 5/2005 | Hoyte et al. | |
| 2005/0179447 A1 * | 8/2005 | Groover et al. | 324/662 |
| 2005/0218887 A1 * | 10/2005 | Twerdochlib | 324/207.16 |
| 2005/0262943 A1 | 12/2005 | Claydon et al. | |
| 2006/0056960 A1 * | 3/2006 | Sabol et al. | 415/118 |
| 2006/0057520 A1 | 3/2006 | Saia et al. | |
| 2006/0210825 A1 * | 9/2006 | Gleeson | C22C 19/03 |
| | | | 428/680 |
| 2006/0283255 A1 | 12/2006 | Tilak et al. | |
| 2007/0101814 A1 | 5/2007 | Campbell et al. | |
| 2007/0119965 A1 * | 5/2007 | Roney et al. | 239/73 |
| 2007/0126548 A1 | 6/2007 | Knobloch et al. | |
| 2007/0184643 A1 * | 8/2007 | Rinne | H01L 21/0272 |
| | | | 438/612 |
| 2008/0055604 A1 | 3/2008 | Sapan et al. | |
| 2008/0134684 A1 | 6/2008 | Umeh et al. | |
| 2008/0174306 A1 | 7/2008 | Brady | |
| 2008/0177492 A1 | 7/2008 | Woodmansee et al. | |
| 2008/0232745 A1 | 9/2008 | Knobloch et al. | |
| 2010/0013464 A1 * | 1/2010 | De Huu et al. | 324/207.11 |
| 2010/0077861 A1 | 4/2010 | Lu | |
| 2010/0079017 A1 | 4/2010 | Lu | |
| 2010/0156629 A1 | 6/2010 | Sexton et al. | |
| 2010/0189444 A1 | 7/2010 | Vernooy et al. | |
| 2010/0242628 A1 | 9/2010 | Knobloch et al. | |
| 2010/0245840 A1 * | 9/2010 | Vernooy et al. | 356/519 |
| 2011/0101967 A1 * | 5/2011 | Kayserman et al. | 324/207.15 |
| 2011/0187353 A1 * | 8/2011 | Mizusaki et al. | 324/207.11 |
| 2012/0128468 A1 * | 5/2012 | Schleif et al. | 415/118 |
| 2012/0168629 A1 * | 7/2012 | Santos et al. | 250/353 |
| 2012/0249281 A1 | 10/2012 | Campbell et al. | |
| 2014/0002360 A1 * | 1/2014 | Nemeth | G05G 9/047 |
| | | | 345/161 |

FOREIGN PATENT DOCUMENTS

| | | |
|---|---|---|
| JP | 2001217045 A | 8/2001 |
| JP | 2002353030 A | 12/2002 |
| JP | 2006215693 A | 8/2006 |
| JP | 2007505499 A | 3/2007 |
| JP | 2009071486 A | 4/2009 |
| JP | 2010056996 A | 3/2010 |

OTHER PUBLICATIONS

Yuqing Lai, Eddy Current Displacement Sensor with LTCC Technology (Feb. 9, 2005) published Ph.D. dissertation, The Albert-Ludwig University of Freiburg (on file with the Albert-Ludwig University of Freiburg).

Search Report by Registered Searching Organization for Application No. 2012-173565 dated May 27, 2016.

Notification of Reasons for Refusal for Application No. 2012-173565 dated Jun. 7, 2016.

* cited by examiner

SENSOR ASSEMBLY FOR ROTATING DEVICES AND METHODS FOR FABRICATING

BACKGROUND OF THE INVENTION

The subject matter disclosed herein relates generally to monitoring systems and, more specifically, to sensor assemblies for use in monitoring the operation of a device.

At least some known turbine engine systems include a compressor, a combustor coupled downstream from the compressor, a turbine, and a rotor assembly rotatably coupled between the compressor and the turbine. Known turbine engine systems may exhibit vibrations or other behavior during operation. At least some known turbine engine systems include monitoring systems that include one or more sensors that measure such behavior and that determine, for example, an amount of vibration exhibited in a rotor assembly, a rotational speed of the rotor assembly, and/or any other suitable operational characteristics of the turbine engine system. At least some known monitoring systems use eddy current (EC) sensors to detect abnormalities and/or defects in a rotating machinery component, such as a rotor assembly. Other known EC inspection devices are used to detect cracks, pings, dings, raised material, and/or other surface imperfections on a surface of the component, and/or to evaluate material properties of the component including the conductivity and/or density of the component.

Known turbine engine systems typically operate at relatively high temperatures. At least some known engine components operate at high temperatures that may damage known EC sensors and that may cause signal degradation, reduced signal strength, and/or reduced signal reliability. As such, the use of EC sensors to monitor engine components that operate at relatively high temperatures may be limited or may not be possible.

BRIEF DESCRIPTION OF THE INVENTION

In one aspect, a sensor assembly is provided. The sensor assembly includes a housing that includes an inner surface that defines a cavity within the housing, and a proximity sensor positioned within the cavity. The proximity sensor includes a first connector, a second connector, and a substantially planar sensing coil that extends between the first connector and the second connector. The sensing coil extends outwardly from the first connector such that the second connector is radially outwardly from the first connector.

In another aspect, a system for monitoring an operation of a device is provided. The system includes a computing device for monitoring a condition of the device, and a sensor assembly that is coupled to the computing device. The sensor assembly is configured to sense a position of a component of the device and to generate a signal indicative of the sensed position. The sensor assembly includes a housing comprising an inner surface that defines a cavity within the housing, and a proximity sensor that is positioned within the cavity. The proximity sensor includes a first connector, a second connector, and a substantially planar sensing coil that extends between the first connector and the second connector. The sensing coil has a substantially spiral shape that extends outwardly from the first connector such that the second connector is radially outwardly from the first connector.

In yet another aspect, a method of fabricating a sensor assembly for use in monitoring a component of a device is provided. The method includes depositing a photoresist material across an outer surface of a sensing coil substrate material. A photoresist pattern is developed on the sensing coil substrate material having a shape substantially similar to a proximity sensor including a first connector, a second connector, and a substantially planar sensing coil extending between the first connector and the second connector. The sensor substrate material is etched to form a proximity sensor.

DETAILED DESCRIPTION OF THE INVENTION

The exemplary methods and systems described herein overcome at least some disadvantages of known monitoring systems by providing a proximity sensor that monitors a component of a device operating in a high temperature environment and/or a low temperature environment. Moreover, the proximity sensor described herein includes a planar sensing coil that has a substantially spiral shape, and that includes a substrate material including a temperature resistance material such as, for example, titanium material or a superalloy material. In addition, by providing a proximity sensor that includes a planar sensing coil, the sensing coil may be fabricated using photoetching or laser cutting. By providing a proximity sensor that monitors high temperature components and low temperature components, the monitoring system described herein facilitates increasing the number of engine components that may be monitored. In addition, by providing a planar sensing coil that may be fabricated using photoetching and/or laser cutting, the geometry of the sensing coil may be optimized to improve the coils electrical characteristics such that a minimal electrical resistance is maintained as well as a low interwinding capacitance. As such, the linear range and proximity performance of the sensing coil is improved.

Figure 1:
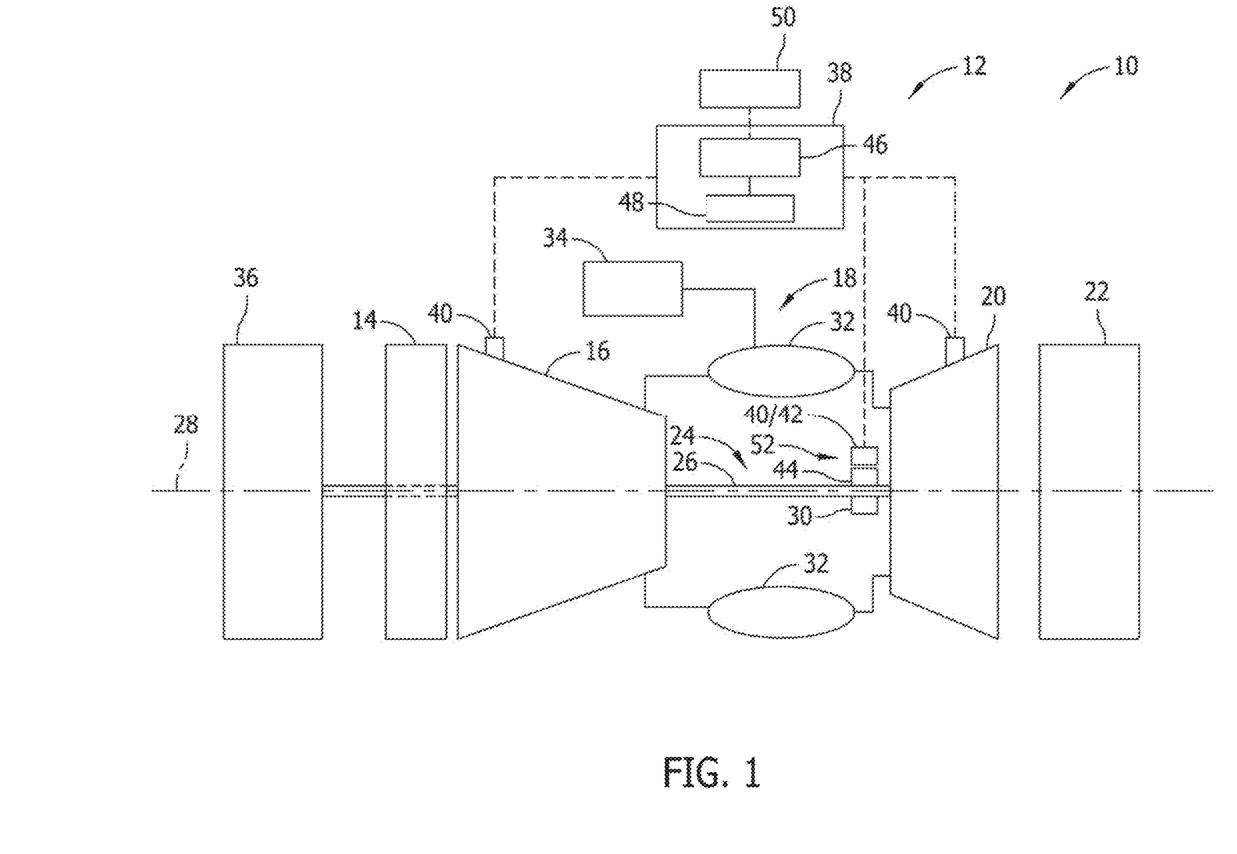
FIG. 1 is a schematic illustration of an exemplary device.
Figure 2:
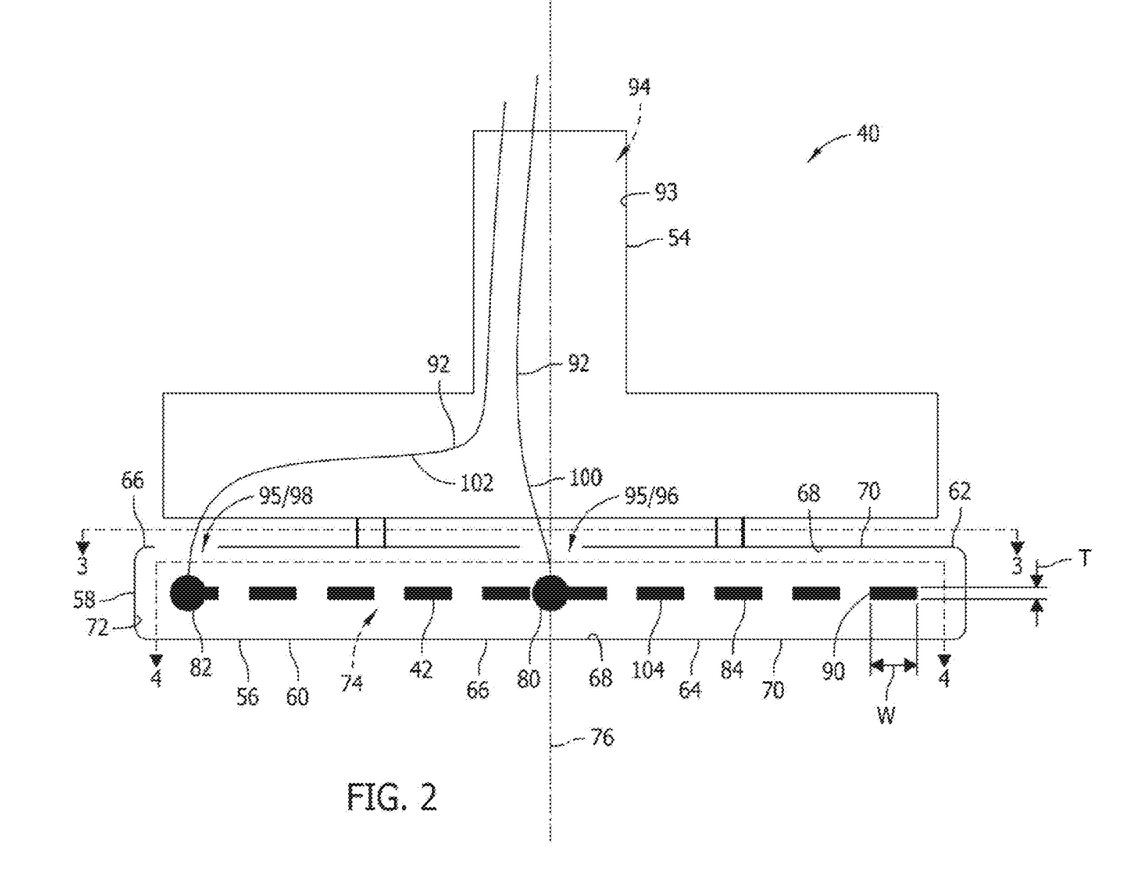
FIG. 2 is a cross-sectional view of an exemplary sensor assembly that may be used with the device shown in FIG. 1.

FIG. 1 is a schematic view of an exemplary device 10. FIG. 2 is a block diagram of an exemplary monitoring system 12 that may be used with device 10. In the exemplary embodiment, device 10 is a turbine engine that typically operates at relatively high operating temperatures. However, it should be apparent to those skilled in the art and guided by the teachings herein that the present invention described herein, may likewise be practiced in any suitable device and is not limited to being practiced in only turbine engines. For example, device 10 may be a refrigeration system such as, for example, cryogenic system that operates at relatively low operating temperatures. Therefore, turbine engine 10 as described and illustrated herein is for illustrative purposes only and is not intended to limit the herein described apparatus and/or method in any aspect. In one embodiment, turbine engine 10 may be a 9FA turbine or a similar device offered by General Electric Company of Schenectady, N.Y.

In the exemplary embodiment, turbine engine 10 includes an intake section 14, a compressor section 16 coupled downstream from intake section 14, a combustor section 18 coupled downstream from compressor section 16, a turbine section 20 coupled downstream from combustor section 18, and an exhaust section 22. A rotor assembly 24 is coupled to turbine section 20 and compressor section 16 and includes a drive shaft 26 that extends between turbine section 20 and compressor section 16 along a centerline axis 28. In addition, rotor assembly 24 also includes at least one support element, such as at least one bearing 30, for supporting drive shaft 26. Combustor section 18 includes a plurality of combustors 32. Combustor section 18 is coupled to compressor section 16 such that each combustor 32 is in flow communication with compressor section 16.

A fuel assembly 34 is coupled to each combustor 32 to provide a flow of fuel to combustor 32. Turbine section 20 is rotatably coupled to compressor section 16 and to an electrical generator 36 with drive shaft 26 to provide electrical energy during operation of turbine engine 10. Generator 36 is coupled to a power source, such as for example, an electric utility grid (not shown) for distributing electrical power to the utility grid.

In the exemplary embodiment, monitoring system 12 includes a computing device 38 that is coupled to a plurality of sensor assemblies 40. Each sensor assembly 40 detects various operating parameters relative to the operation of and environmental conditions of turbine engine 10. Sensor assemblies 40 may include, but are not limited to only including, vibration sensors, position sensors, temperature sensors, acceleration sensors, fluid pressure sensors, power load sensors, and/or any other sensors that sense various parameters relative to the operation of turbine engine 10. As used herein, the term "parameters" refers to physical properties whose values can be used to define the operating and environmental conditions of turbine engine 10, such as relative position of a component, vibration, temperatures, fluid pressures, electric power loading, rotational speed, and fluid flows at defined locations.

In the exemplary embodiment, monitoring system 12 includes at least one sensor assembly 40 in the form of a proximity sensor 42. Proximity sensor 42 is positioned adjacent to a component 44 of turbine engine 10, such as for example, compressor section 16, turbine section 20, drive shaft 26 and/or bearing 30 for sensing a vibration and/or a relative position of component 44 as the component rotates. Proximity sensor 42 is coupled to computing device 38 and is configured to sense a position of component 44 with respect to proximity sensor 42 and is configured to transmit the sensed position to computing device 38.

Computing device 38 includes a processor 46 and a memory device 48. Processor 46 is coupled in communication with proximity sensor 42, and includes any suitable programmable circuit which may include one or more systems and microcontrollers, microprocessors, reduced instruction set circuits (RISC), application specific integrated circuits (ASIC), programmable logic circuits (PLC), field programmable gate arrays (FPGA), and any other circuit capable of executing the functions described herein. The methods described herein may be encoded as executable instructions embodied in a non-transitory computer readable medium, including, without limitation, a storage device and/or a memory device. Such instructions, when executed by a processor, cause the processor to perform at least a portion of the methods described herein. The above examples are exemplary only, and thus are not intended to limit in any way the definition and/or meaning of the term "processor." In the exemplary embodiment, memory device 48 is one or more devices that enable information, such as executable instructions and/or other data, to be selectively stored and retrieved. Memory device 48 may include one or more computer readable media, such as, without limitation, dynamic random access memory (DRAM), static random access memory (SRAM), a solid state disk, and/or a hard disk. Memory device 48 may be configured to store, without limitation, executable instructions and/or any other type of data suitable for use with the methods described herein.

Computing device 38 also includes a display 50 for displaying a graphical representation and/or notification to a user. Display 50 is coupled to processor 46 and may include a vacuum fluorescent display (VFD) and/or one or more light-emitting diodes (LED). Additionally or alternatively, display 50 may include, without limitation, a liquid crystal display (LCD), a cathode ray tube (CRT), a plasma display, and/or any suitable visual output device capable of displaying graphical data and/or text to user. In the exemplary embodiment, a vibration of component 44, a position of component 44, and/or any other information may be displayed to user on display 50. In addition, a graphical representation of a position and/or a vibration of component 44 may be displayed to user on display 50.

During operation, intake section 14 channels air towards compressor section 16. Compressor section 16 compresses the inlet air to a higher pressure and temperatures and discharges compressed air towards combustor section 18. Fuel is channeled from fuel assembly 34 to each combustor 32 wherein it is mixed with the compressed air and ignited in combustor section 18. Combustor section 18 channels combustion gases to turbine section 20 wherein gas stream thermal energy is converted to mechanical rotational energy to drive compressor section 16 and/or generator 36. Exhaust gases exit turbine section 20 and flow through exhaust section 22 to ambient atmosphere or a use location such as a heat recovery system. In the exemplary embodiment, proximity sensor 42 produces eddy currents to generate a signal indicative of a position and/or vibration of component 44. More specifically, proximity sensor 42 produces eddy currents to generate a signal indicative of a gap 52 or space between rotating machinery components 44, such as a gap or space between drive shaft 26 and proximity sensor 42. Proximity sensor 42 may transmit a signal continuously, periodically, or only once and/or any other signal timing that enables computing device 38 to monitor the condition of component 44. Moreover, proximity sensor 42 may transmit a signal either in an analog form or in a digital form. Computing device 38 receives the generated signal from proximity sensor 42 and calculates a position and/or a vibration of component 44 based, at least in part, on the received signal. In addition, computing device 38 displays a graphical representation of the calculated position and/or calculated vibration of component 44 on display 50. Moreover, computing device 38 may generate an audible or visual alarm signal if the condition of component 44 falls outside of predetermined threshold values.

Figure 3:
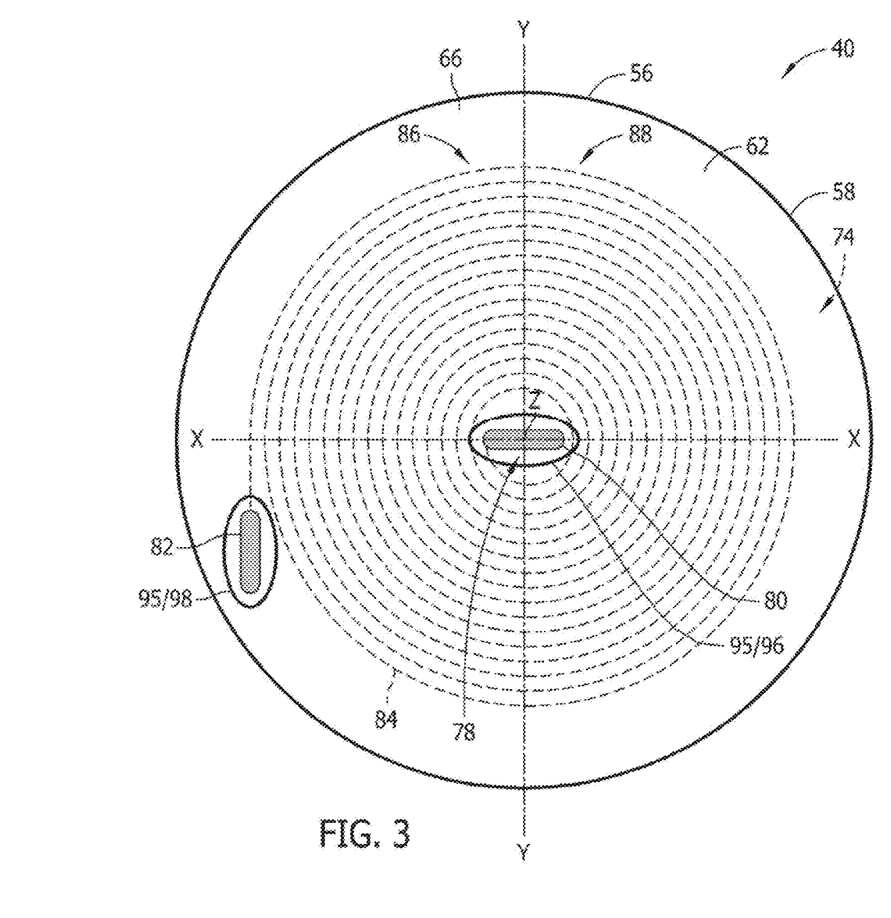
FIG. 3 is a partial cross-sectional view of the sensor assembly shown in FIG. 2 and taken along line 3-3.
Figure 4:
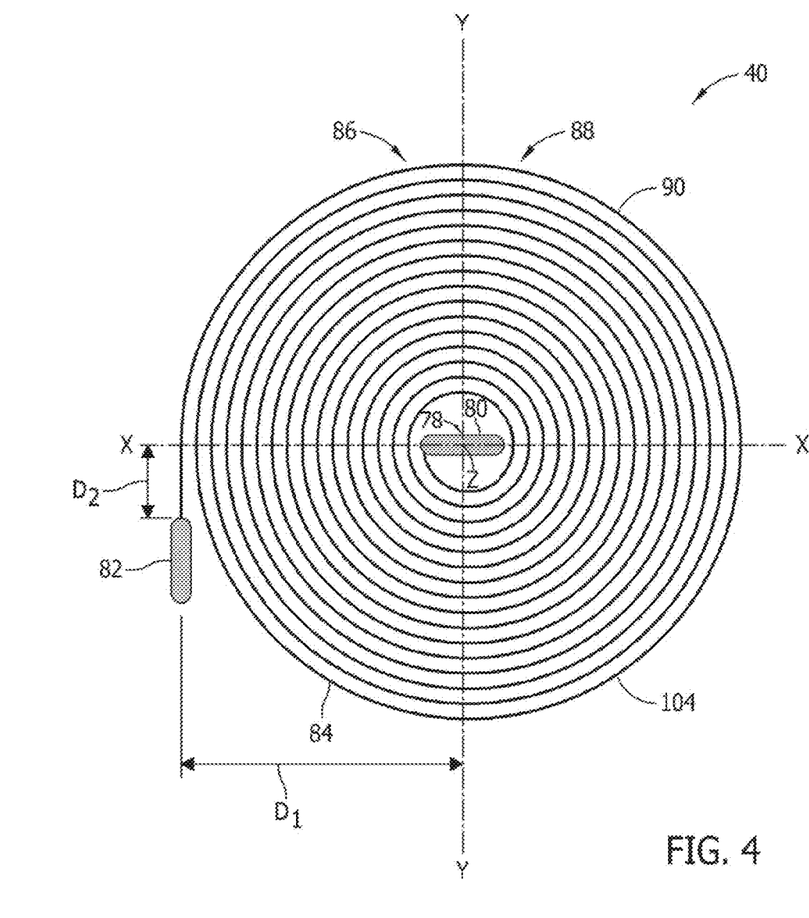
FIG. 4 is another partial cross-sectional view of the sensor assembly shown in FIG. 2 and taken along line 4-4.

FIG. 2 is a cross-sectional view of an exemplary sensor assembly 40. FIG. 3 is a partial cross-sectional view of sensor assembly 40 taken approximately along line 3-3. FIG. 4 is partial cross-sectional view of sensor assembly 40 taken approximately along line 4-4. In the exemplary embodiment, sensor assembly 40 includes a probe casing 54, a sensor housing 56 that is coupled to probe casing 54, and a proximity sensor 42 that is positioned within sensor housing 56. Sensor housing 56 includes a sidewall 58 that extends between a forward endwall 60 and an opposite aft endwall 62. Aft endwall 62 is closer to probe casing 54 than forward endwall 60 is, and is positioned such that sensor housing 56 is supported from probe casing 54.

In the exemplary embodiment, sensor housing 56 also includes an outer surface 64 that has a substantially disk shape. Forward and aft endwalls 60 and 62 each include a disk-shaped body 66 that extends between an inner surface 68 and an outer surface 70. Sidewall 58 includes a radially inner surface 72 that has a substantially cylindrical shape that defines a cavity 74 therein. Cavity 74 extends between forward and aft endwalls 60 and 62. Inner surface 72 extends axially along a centerline axis 76 between endwalls 60 and 62. Cavity 74 is sized and shaped to receive proximity sensor 42 therein. In an alternative embodiment, housing 56 may be triangular, square, rectangular, polygonal, or any suitable shape that enables sensor assembly 40 to function as described herein.

Referring to FIGS. 3 and 4, in the exemplary embodiment, three perpendicular axes X, Y, and Z extend through proximity sensor 42 to define a three-dimensional Cartesian coordinate system relative to proximity sensor 42. More specifically, in the exemplary embodiment, the Z-axis is substantially coaxial with a centerpoint 78 of proximity sensor 42, and such that the X-axis and the Y-axis intersect to form an X-Y reference plane. In the exemplary embodiment, proximity sensor 42 includes a first connector 80, a second connector 82, and a sensing coil 84 that extends between first connector 80 and second connector 82.

Sensing coil 84 is substantially planar and has a substantially spiral shape 86 that is contained substantially within the X-Y reference plane. Sensing coil 84 includes a plurality of turns 88 that extend outwardly from first connector 80 such that second connector 82 is positioned radially outwardly from first connector 80. In an alternative embodiment, sensing coil 84 may include a triangle, a square, a rectangle, a polygon, or any suitable shape to enable proximity sensor to function as described herein.

In the exemplary embodiment, first connector 80 is oriented with respect to centerpoint 78, and sensing coil 84 extends outwardly from first connector 80 such that second connector 82 is positioned a first distance $D_1$ from first connector 80 along the X-axis, and is positioned a second distance $D_2$ from first connector 80 along the Y-axis. In the exemplary embodiment, second connector 82 is oriented substantially parallel to the Y-axis, and first connector 80 is oriented substantially parallel to the X-axis, such that second connector 82 is oriented substantially perpendicular to first connector 80 within the X-Y reference plane. In an alternative embodiment, second connector 82 may be oriented obliquely to first connector 80, or second connector 82 may be oriented substantially parallel to first connector 80. In one embodiment, sensing coil 84 is positioned within housing cavity 74 such that first connector 80 is oriented with respect to centerline axis 76. Alternatively, sensing coil 84 may be positioned within housing 56 such that first connector 80 is offset a distance from centerline axis 76.

Sensing coil 84 includes a substantially flat bar 90 that has a rectangular cross-sectional shape and includes a radial width W (shown in FIG. 2) measured along the X-Y reference plane, and a thickness T measured along the Z-axis. In an alternative embodiment, sensing coil 84 may have any suitable cross-sectional shape to enable sensor assembly 40 to function as described herein. In the exemplary embodiment, radial width W is larger than thickness T. Alternatively, radial width W may be less than, or equal to thickness T.

In the exemplary embodiment, sensor assembly 40 includes one or more connection cables 92 that extend between sensing coil 84 and computing device 38 to electrically couple sensing coil 84 to computing device 38 (shown in FIG. 1). Each connection cable 92 may include one or more electrical wires (not shown). Probe casing 54 includes an inner surface 93 that defines a cavity 94 that is sized to receive connection cables 92 therein such that cables 92 extend from computing device 38 to sensing coil 84 through probe casing 54. Housing 56 includes one or more openings 95 defined therein that are each sized and shaped to receive one or more connection cables 92 therethrough to facilitate electrically coupling sensing coil 84 to computing device 38. In the exemplary embodiment, aft endwall 62 includes a first opening 96 that is oriented with respect to first connector 80, and a second opening 98 that is oriented with respect to second opening 98. A first connection cable 100 extends through first opening 96 and is coupled to first connector 80. A second connection cable 102 extends through second opening 98 and is coupled to second connector 82.

In the exemplary embodiment, sensor assembly 40 may operate in environments that have operating temperatures within a temperature range between about −200° C. to about 1000° C. In the exemplary embodiment, housing 56 and probe casing 54 are each fabricated at least partially from a ceramic material. In one embodiment, housing 56 and probe casing 54 are each fabricated from materials including at least one of a alumina (for example, 92% alumina), aluminum nitride, borosilicate glass, quartz, sialon, low-temperature co-fired ceramic, silicon nitride, alumina, silicon carbide, sapphire, zirconia, or any other suitable technical ceramic material. In the exemplary embodiment, sensing coil 84 includes a substrate material 104 that includes a titanium material. In an alternative embodiment, substrate material 104 includes a superalloy such as, for example Inconel®, or Incoloy®. Alternatively, substrate material 104 includes a stainless steel, or a nickel alloy such as, for example, nickel cobalt. In the exemplary embodiment, sensing coil 84 is fabricated from a substantially flat plate using photoetching or laser cutting.

Figure 5:
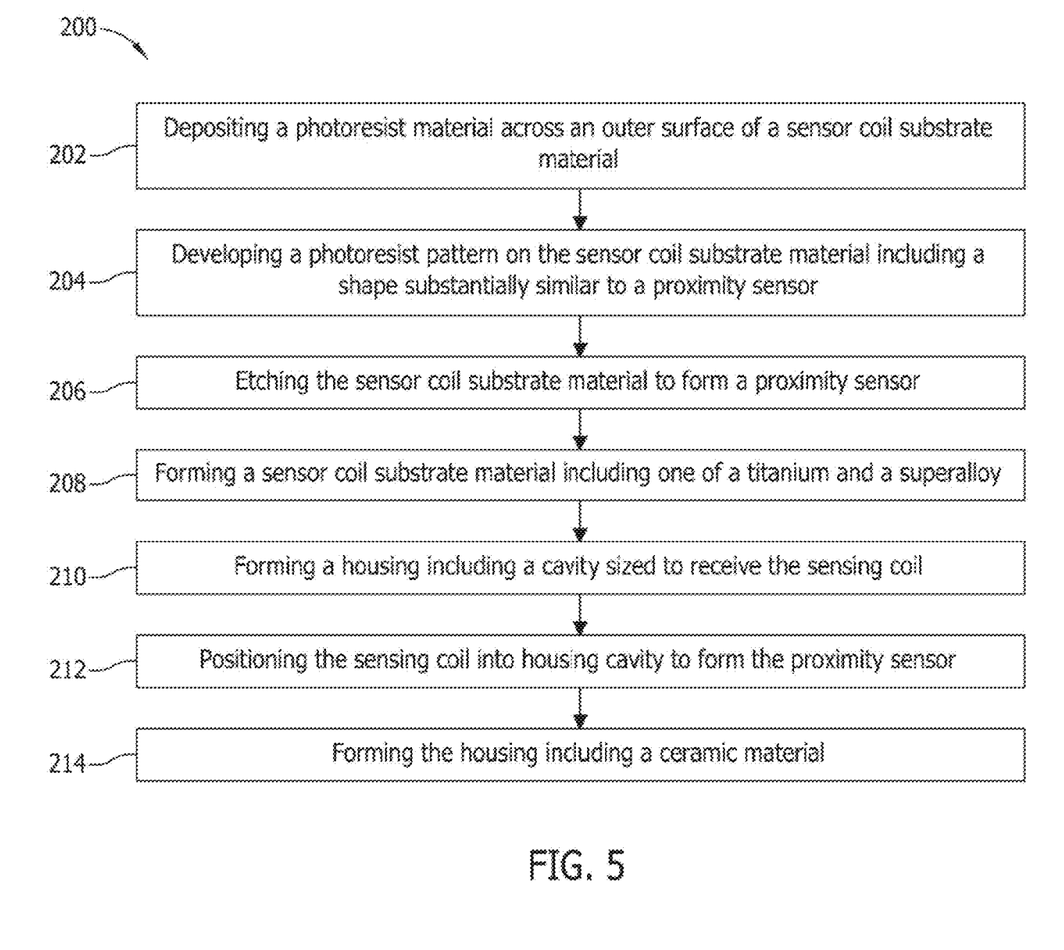
FIG. 5 is a flowchart of an exemplary method that may be used to fabricate the sensor assembly shown in FIG. 2.

FIG. 5 is a flowchart of an exemplary method 200 that may be implemented in fabricating sensor assembly 40. In the exemplary embodiment, method 200 includes depositing 202 a photoresist material across an outer surface of sensing coil substrate material 104. A photoresist pattern developed 204 across sensing coil substrate material 104 has a shape substantially similar to a proximity sensor 42 that includes first connector 80, second connector 82, and sensing coil 84, wherein sensing coil 84 is generally spiral shaped. Sensing coil substrate material 104 is then etched 206 to form proximity sensor 42. In the exemplary embodiment, method 200 also includes forming 208 sensing coil substrate material 104 from materials including at least one of a titanium material and a superalloy material. In addition, method 200 also includes forming 210 housing 56, including cavity 74, and inserting 212 sensing coil 84 into cavity 74 to form proximity sensor 42. Moreover, method 200 may include forming 214 housing 56 from at least a ceramic material. In one embodiment, method 200 includes forming 214 housing 56 and or probe casing 54 from materials including at least one of a alumina (for example, 92% alumina), aluminum nitride, borosilicate glass, quartz, sialon, low-temperature co-fired ceramic, silicon nitride, alumina, silicon carbide, sapphire, and zirconia.

In one embodiment, a photoresist material is deposited across a first side of substrate material 104 and also across an opposite second side of substrate material 104. An image of sensing coil 84 is then printed onto a plurality of film sheets, such as for example, mylar sheets. Each printed sheet is mounted to each side of substrate material 104 and is oriented such that each side of substrate material 104 includes a substantially identical image of sensing coil 84. The printed sheets are coupled to the photoresist coated substrate material 104 such that a portion of the photoresist material, corresponding to the shape of sensing coil 84 remains exposed. Each side of substrate material 104 is then exposed to UV light for a predefined period of time to cure the exposed photoresist material. Uncured photoresist material is removed from substrate material 104 to expose bare material. Substrate material 104 is then coated with an etching solution to facilitate etching and removing the bare material from the substrate material 104. The remaining photoresist material is then removed from the substrate material to form sensing coil 84.

The size and shape of sensing coil 84 is selected to enable sensor assembly 40 to sense a position and/or a vibration of a gas turbine component operating within an operating temperature range of between about −200° C. to about 1000° C. Moreover, the size and shape of sensing coil 84 is selected to enable sensing coil 84 to be fabricated using photoetching and/or laser cutting, and to include a substrate material 104 that includes a high temperature resistant material such as, for example, titanium or a superalloy. By providing a proximity sensor that monitors high temperature components and low temperature components, the monitoring system described herein facilitates increasing the number of engine components that may be monitored as compared to the components that may be monitored using known monitoring systems. In addition, by providing a planar sensing coil that may be fabricated using photoetching and/or laser cutting, the geometry of the sensing coil may be optimized to improve the coils electrical characteristics such that a minimal electrical resistance is maintained as well as a low interwinding capacitance. As such, the linear range and proximity performance of the sensing coil is improved as compared to known sensing coils.

The above-described methods and systems overcome at least some disadvantages of known monitoring systems by providing a proximity sensor that may monitor a device component operating in a high temperature environment and/or operating in a low temperature environment. Moreover, the proximity sensor described herein includes a substrate material that includes a temperature resistance material such as, for example, a titanium material or a superalloy material. In addition, the sensor assembly described herein includes a planar sensing coil having a substantially spiral shape that facilitates fabricating the sensing coil using photoetching or laser cutting. By providing a planar sensing coil that may be fabricated using photoetching and/or laser cutting, the cost of manufacturing a monitoring system is reduced over known monitoring systems.

Exemplary embodiments of a sensor assembly for use with monitoring an operation of a device and method for fabricating the sensor assembly are described above in detail. The systems and methods are not limited to the specific embodiments described herein, but rather, components of the systems and/or steps of the methods may be utilized independently and separately from other components and/or steps described herein. For example, the methods may also be used in combination with other monitoring systems, and are not limited to practice with only the system as described herein. Rather, the exemplary embodiment can be implemented and utilized in connection with many other monitoring system applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A sensor assembly for monitoring an operation of a device, comprising:
   a housing comprising a surface that defines a cavity within the housing; and
   a proximity sensor positioned within the cavity, the proximity sensor comprising a first connector, a second connector, and a planar sensing coil that extends between the first connector and the second connector, wherein the sensing coil is a unitary component fabricated from a substrate material comprising at least one of a titanium and a nickel-based superalloy, the sensing coil extends outwardly from the first connector such that the second connector is radially outwardly from the first connector, wherein the sensor assembly such configured is capable to operate in environments that include all operating temperatures from −200° C. to 1000° C.

2. The sensor assembly of claim 1, wherein the sensing coil comprises a flat bar having a rectangular cross-sectional shape.

3. The sensor assembly of claim 1, wherein the housing comprises a ceramic material.

4. The sensor assembly of claim 1, wherein the sensing coil comprises a spiral shape extending outwardly from the first connector to the second connector.

5. The sensor assembly of claim 1, wherein the housing comprises at least one opening extending through the housing, the at least one opening is sized to receive a connection cable therein to enable the proximity sensor to electrically couple to a computing device.

6. The sensor assembly of claim 1, wherein the sensor assembly produces eddy currents to generate a signal indicative of a gap between a component of the device and the sensor assembly.

7. A system for monitoring an operation of a device, the system comprising:
   a computing device for monitoring a condition of the device; and a sensor assembly coupled to the computing device, the sensor assembly configured to sense a position of a component of the device, to generate a signal indicative of the sensed position, the sensor assembly comprising:
   a housing comprising an inner surface that defines a cavity within the housing; and
   a proximity sensor positioned within the cavity, the proximity sensor comprising a first connector, a second connector, and a planar sensing coil that extends between the first connector and the second connector, the sensing coil extends outwardly from the first connector such that the second connector is radially outwardly from the first connector; wherein the sensor assembly such configured is capable to operate in environments that include all operating temperatures from −200° C. to 1000° C.

8. The system of claim 7, wherein the sensing coil comprises a flat bar having a rectangular cross-sectional shape.

9. The sensor assembly of claim 7, wherein the sensing coil comprises a substrate material comprising at least one of a titanium and a superalloy.

10. The sensor assembly of claim 7, wherein the housing comprises a ceramic material.

11. The sensor assembly of claim 7, wherein the sensing coil comprises a spiral shape extending outwardly from the first connector to the second connector.

12. The sensor assembly of claim 7, wherein the housing comprises at least one opening extending through the housing, the at least one opening is sized to receive a connection cable therein to enable the proximity sensor to electrically couple to the computing device.

13. The sensor assembly of claim 7, wherein the sensor assembly produces eddy currents to generate a signal indicative of a gap between the component and the sensor assembly.

14. The sensor assembly of claim 9, wherein the sensing coil is a unitary component fabricated from the substrate.

* * * * *